US005481230A

United States Patent [19]
Chang et al.

[11] Patent Number: 5,481,230
[45] Date of Patent: Jan. 2, 1996

[54] PHASE MODULATOR HAVING INDIVIDUALLY PLACED EDGES

[75] Inventors: Paul Chang, Westford; Dan H. Wolaver, West Brookfield, both of Mass.; J. Howell Mitchell, Jr., Amherst, N.H.

[73] Assignee: Tektronix, Inc., Wilsonville, Oreg.

[21] Appl. No.: 339,420

[22] Filed: Nov. 14, 1994

[51] Int. Cl.$^6$ ....................................................... H03C 3/00
[52] U.S. Cl. ............................ 332/112; 332/144; 375/271; 455/42; 455/110
[58] Field of Search ...................................... 332/103, 104, 332/105, 112, 113, 117, 144, 146; 375/271, 279, 280, 308; 455/42, 110

[56] References Cited

U.S. PATENT DOCUMENTS

| | | | |
|---|---|---|---|
| 3,559,103 | 1/1971 | Cooper | 332/9 |
| 4,253,071 | 2/1981 | Underhill et al. | 332/113 |
| 4,321,687 | 3/1982 | Parsons et al. | 364/900 |
| 4,417,352 | 11/1983 | Shepard | 377/43 |
| 4,564,953 | 1/1986 | Werking | 377/52 |
| 4,608,706 | 8/1986 | Chang et al. | 377/39 |
| 4,714,924 | 12/1987 | Ketzler | 340/825.210 |
| 4,746,880 | 5/1988 | McCune, Jr. | 332/16 R |
| 4,870,665 | 9/1989 | Vaughn | 328/61 |
| 5,039,950 | 8/1991 | McDermott | 328/62 |
| 5,293,628 | 3/1994 | Langan et al. | 395/550 |
| 5,313,622 | 5/1994 | Truchard et al. | 395/550 |

OTHER PUBLICATIONS

DP8391 Serial Network Interface (DPLL), National Seimiconductor, (1993).
MC10136 Applications Information, Motorola, (1993).
MC10E195/MC100E195 Technical Data, Motorola, (1993).
STEL–2173 Technical Data Sheet, Stanford Telecom, (Apr., 1991).

Primary Examiner—Siegfried H. Grimm
Attorney, Agent, or Firm—James M. Smith

[57] ABSTRACT

A phase modulator circuit and method for generating an output signal having individually positionable edges is described. The phase modulator includes a programmable pulse generator, such as an interval counter, or a delay for producing the output signal, and a control value source, such as a memory, for delivering a sequence of control values to the generator. The control values determine the time between successive output pulses.

33 Claims, 10 Drawing Sheets

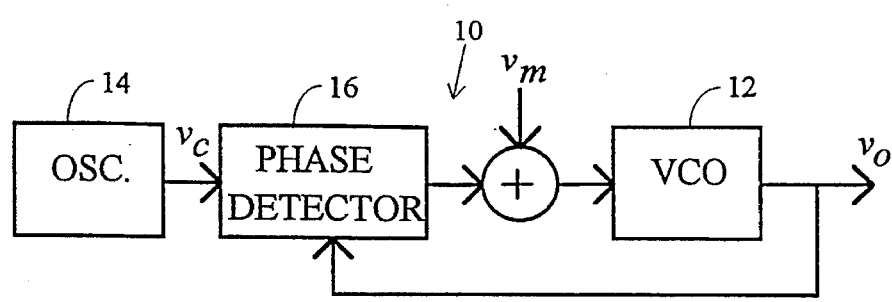
Figure 1  *Prior Art*
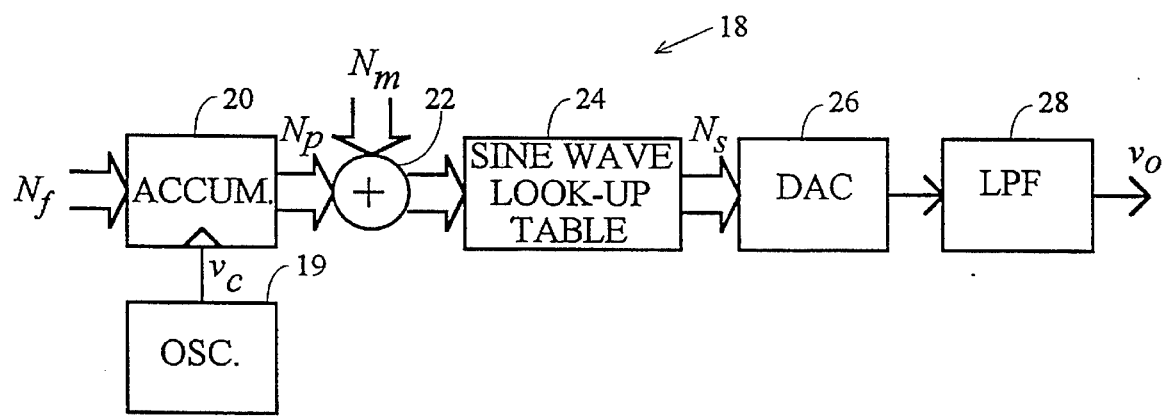
Figure 2  *Prior Art*

PHASE MODULATOR HAVING INDIVIDUALLY PLACED EDGES

BACKGROUND OF THE INVENTION

Clock signals are square waves used for timing digital systems. Spurious phase modulation of clock signals can lead to problems in system operation. Therefore, it is useful to simulate this spurious modulation with a clock phase modulator to test system performance under stressed conditions.

One technique for phase modulation is illustrated in FIG. 1. A phase-locked loop (PLL) 10 includes a voltage-controlled oscillator (VCO) 12 that is locked to a carrier signal $v_c$ from an oscillator 14. A modulating signal $v_m$ added after a phase detector 16 causes the output signal $v_o$ to be phase-modulated.

One disadvantage of the PLL method is the limited dynamic range of the phase detector 16 and its possible non-linearity. This limits the amplitude of the phase modulation and may cause amplitude distortion. Another disadvantage is the limited frequency range of the closed-loop design and its likely non-flat frequency response. This limits the frequency of the phase modulation and possibly causes frequency distortion. A more thorough treatment of phase modulation using PLLs is discussed in *Phase-Locked Loop Circuit Design*, by D. H. Wolaver, Section 9–1 (Prentice-Hall, 1991).

Another known technique for phase modulation is a direct digital synthesizer (DDS) as shown in FIG. 2. A DDS 18 may have a numerical input $N_m$ that controls the phase of the output signal $v_o$. At each pulse of a clock signal $v_c$ from an oscillator 19, a number $N_f$ is added to an accumulator 20, forming a number $N_p$ representing the phase. A number $N_m$ proportional to the phase modulation is added to $N_p$ at summer 22. The sum $N_p + N_m$ serves as the address for a look-up table 24 that provides a number $N_s$. $N_s$ is the value of a sine wave for the phase represented by the sum $N_p + N_m$. A digital-to-analog converter (DAC) 26 and a low-pass filter (LPF) 28 produce a sinusoidal voltage $v_o$ proportional to $N_s$. The Stanford Telecommunications STEL-2173 device is an example of such a DDS.

A disadvantage of the DDS method is the complexity of the circuitry and its resulting high cost, especially for high-speed operation. In particular, the accumulator 20, the sine wave look-up table 24, and the DAC 26 each require large circuits. The size of the circuitry results in delays that slow the speed of operation. Therefore, high-speed operation requires expensive technology such as gallium arsenide semiconductors.

SUMMARY OF THE INVENTION

The previously mentioned drawbacks are overcome and other advantages achieved with the present invention. In one form, the present invention comprises an apparatus and method for generating an output signal having individually positionable edges. The phase modulator of the present invention comprises a programmable pulse generator, such as an interval counter or a delay, for producing an output signal and a control value source for delivering a sequence of control values to the generator. The control values determine the time between successive output pulses.

More specifically, the position of each edge of the output signal relative to an input waveform such as a square wave clock signal is determined in response to a control value. By providing succeeding control values in response to edges of the output signal, each next control value in the sequence is made available to the programmable pulse generator within the time between successive edges of the output signal. Accordingly, the pulse generator is set up at a time which avoids any spurious, misplaced, or missing edges resulting from changing the control values independent of the output signal.

In another aspect of the invention, the control value source may include a numerical processor for converting stored values, representing the time difference between an edge of the output signal and the corresponding edge of the input waveform, into control values representing the time difference between successive edges of the output signal.

In a preferred embodiment, a control value source comprises memory and the programmable pulse generator comprises both a programmable interval counter and a programmable delay circuit.

In another embodiment, a programmable delay circuit comprises two delay lines in parallel, the first delay line being responsive to odd-ordered control values and the second delay line being responsive to even-ordered control values. The two delay line signals are multiplexed to produce a desired modulated output signal. With parallel delay lines, slower set-up times may be tolerated.

BRIEF DESCRIPTION OF THE DRAWINGS

The foregoing and other objects, features, and advantages of the invention will be apparent from the following more particular description of preferred embodiments of the drawings in which like reference characters refer to the same parts throughout the different views. The drawings are not necessarily to scale, emphasis instead being placed upon illustrating the principles of the invention.

FIG. 1 is a block diagram of a prior art phase modulator with a phase-locked loop.

FIG. 2 is a block diagram of a prior art phase modulator using a direct digital synthesizer.

DETAILED DESCRIPTION OF THE INVENTION

The preferred system of the present invention modulates a square wave in a novel way; it governs the position of each edge of the output signal rather than governing the phase or frequency directly. The result is the same as phase or frequency modulation, but the method is simpler and, therefore, faster and less expensive. It uses edge-control circuits in an architecture that allows individual placement of each edge based upon a sequence of control values provided sequentially in response to the output signal. The control values may correspond to the time difference between successive edges of the output signal. They may be, or may be obtained from, values representing the time difference between an edge of the output signal and a corresponding edge of the input signal.

Figure 3:
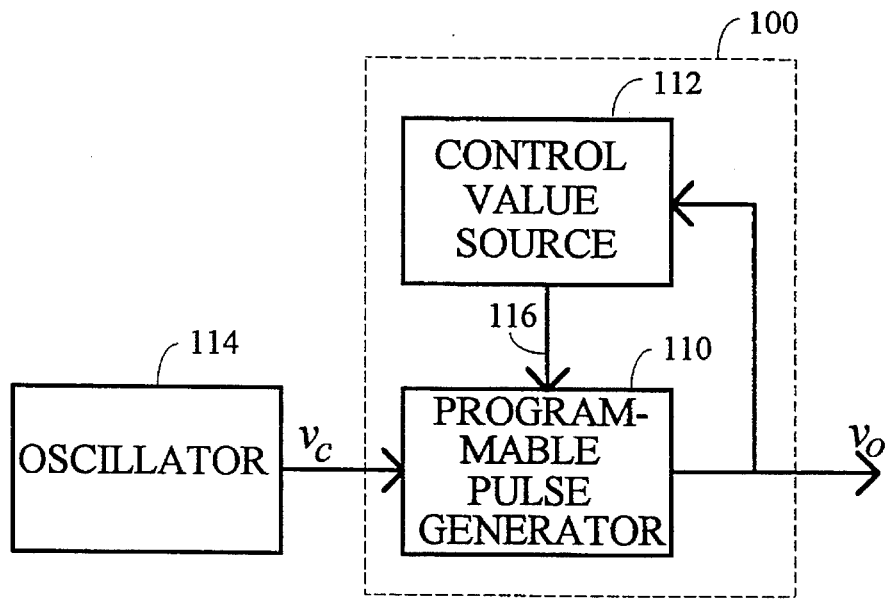
FIG. 3 is a block diagram of a general embodiment of the invention.

In accordance with the present invention, FIG. 3 illustrates a phase modulator 100 which has a programmable pulse generator 110 and a control value source 112. An external oscillator 114 generates an input signal $v_c$ with frequency $f_c$ which is an input to programmable pulse generator 110. Programmable pulse generator 110 generates an output waveform $v_o$. Control value source 112 outputs a control value signal 116 to programmable pulse generator 110. The programmable pulse generator 110 uses the input signal $v_c$ and the control value signal 116 from the control value source 112 in order to generate the output waveform $v_o$. Output waveform $v_o$ can be generated so that its edges (rising, falling, or both) are individually positioned relative to each other or to the input signal $v_c$ as determined by the value of the control value signal 116.

The control value source 112 outputs a new control value on the control value signal 116 in response to an edge of the output signal $v_o$ which forms an input to the control value source 112. The control values output by the control value source 112 may form an arbitrary or ordered sequence such that the result is a square wave clock signal $v_o$ with edges placed in any desired pattern. Since the transition to a new control value is made in response to the edges of $v_o$, the generation of spurious, misplaced, or missing edges in the output $v_o$ may be avoided as described further below. The sequence of control values is dynamic because the rate at which control value transitions occur is on the order of the nominal frequency of edges in the output signal; preferably, control value transitions occur with each edge. Since the sequence of control values is dynamic, the phase modulation achieves wide bandwidth and wide dynamic range. The circuitry is also simpler and cheaper than that of the prior art.

Figure 4:
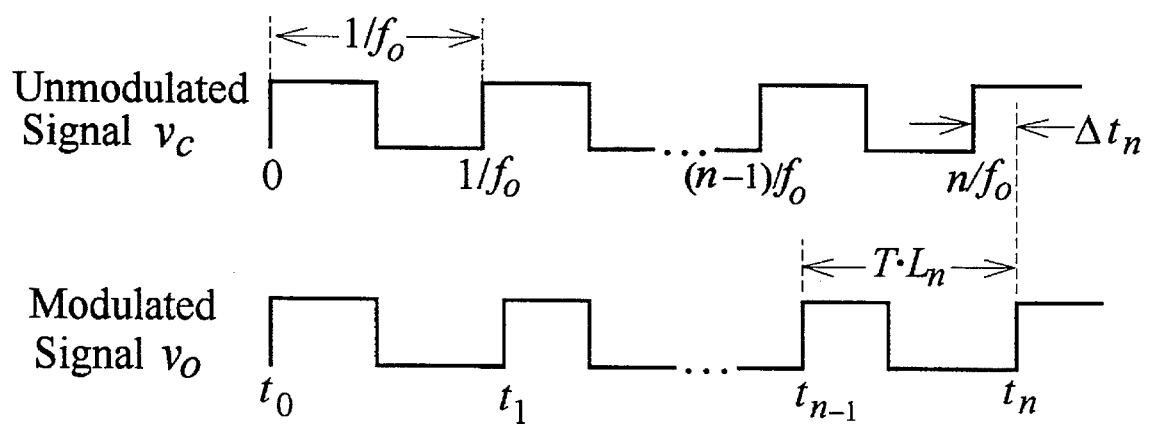
FIG. 4 is a timing diagram illustrating the edge positions in time produced by a system embodying the present invention.

For a given phase modulation, it is possible to calculate the positions in time of the edges of a square wave as illustrated in FIG. 4. An algorithm for this calculation is given below. Let the position of the nth edge be $t_n$, which is a sequence of monotonically increasing times. To bound the control values, it is usually convenient to calculate the difference $\Delta t_n$ between each $t_n$ and its position if the square wave had not been phase-modulated. Let the constant interval between unmodulated edges be $1/f_o$. Then $$\Delta t_n = t_n - n/f_o$$

If time is quantized into increments of T, these edge positions can be stored in a memory as values $N_n$, where $$N_n = \Delta t_n / T \qquad (\text{Eq. 1})$$

rounded to the nearest integer. A new value may be provided from memory for each edge. Where the programmable pulse generator 110 is a delay circuit, the value $N_n$ can be read from memory and used directly to control the delay of an input pulse and thus locate an output edge. However, the pulse generator may also be an interval counter which counts input pulses to locate an edge some number of input pulses after a prior edge. In that case, the values $N_n$ may be converted into values $M_n$ representing the difference between succeeding $N_n$: $M_n = N_n - N_{n-1}$. The $M_n$ values may then be added to a constant K, where $K = f_c/f_o$, resulting in values $L_n$ representing the spacing $t_n - t_{n-1}$ between successive edges of the output signal:

$$\begin{aligned} L_n &= (t_n - t_{n-1})/T \\ &= (\Delta t_n - \Delta t_{n-1} + 1/f_o)/T \\ &= N_n - N_{n-1} + K \end{aligned}$$

$L_n$ can be read from a control value memory and applied to a programmable interval counter to control edge positions in time. Alternatively, the $N_n$ values can be read from memory, and the values can be converted into edge positions in time ($L_n$) using simple circuitry that is fast and inexpensive.

Figure 5:
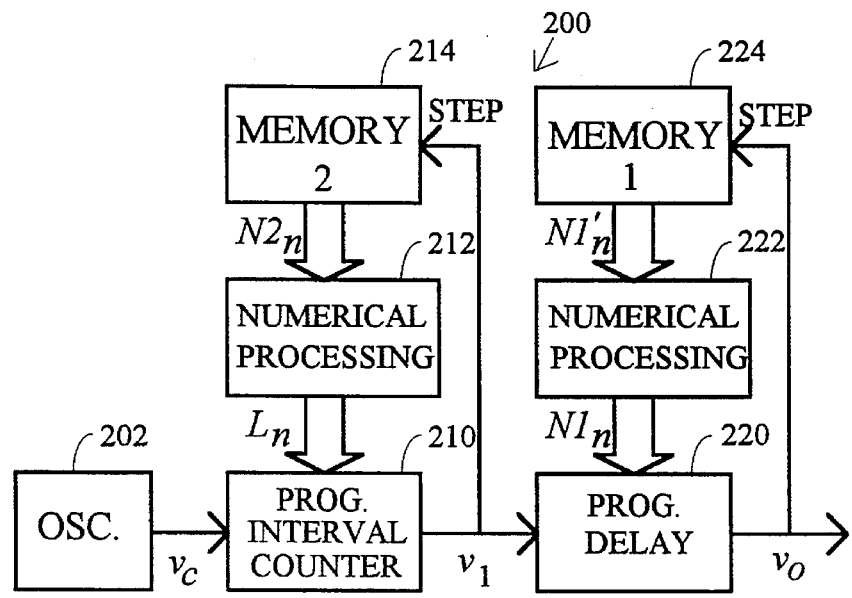
FIG. 5 is a block diagram of an embodiment of the present invention.

In the embodiment of FIG. 5, the programmable pulse generator comprises both a programmable interval counter 210 and a programmable delay 220. The control value source comprises memory devices 214 and 224 and may include numerical processors 212 and 222. The Programmable Interval Counter generates pulses spaced L cycles of the oscillator apart. A Programmable Delay changes its delay in response to N1.

The advantage of using a programmable interval counter is that it allows a wide range of a nominal frequencies in $v_o$. The programmable interval counter divides down the input frequency $f_c$ of input signal $v_c$, so the output frequency can be anywhere from $f_c$ divided by the maximum interval of the counter up to $f_c$ itself. However, to provide high phase resolution or a high output frequency, a very high speed clock would be required. The use of a programmable delay allows for a higher phase resolution. On the other hand, if only the programmable delay line were used, the length of the delay line might have to be too great to provide a sufficient dynamic range.

The delay may even provide a frequency output higher than that of the input clock by sequentially decreasing the delay time as an input clock pulse passes through the delay. This results in multiple output pulses from the delay for each input pulse.

In the discussion of frequency and phase, it should be recognized that any change in frequency can be seen as a change in phase and any change in phase can be seen as a change in frequency. Accordingly, a phase modulator can be seen to modulate both frequency and phase.

The memories of FIG. 5 are stepped in response to the delayed outputs they respectively produce. The numerical processing may be omitted, and either the Programmable Interval Counter or the Programmable Delay may be omitted The memories 214, 224 storing the $N1'_n$ and the $N2_n$ may share the same physical device and even share the same addresses. It is usually preferable to have Memory 224 step to the next address in response to the signal $v_l$, but it may be simpler in some cases to have it respond to signal $v_o$ instead. Similarly, it is usually preferable to have Memory 214 step to the next address in response to the signal $v_o$, but it may be simpler in some cases to have it respond to signal $v_l$ instead. The result is a square-wave clock signal $v_o$ with edges placed in any desired pattern.

Figure 6:
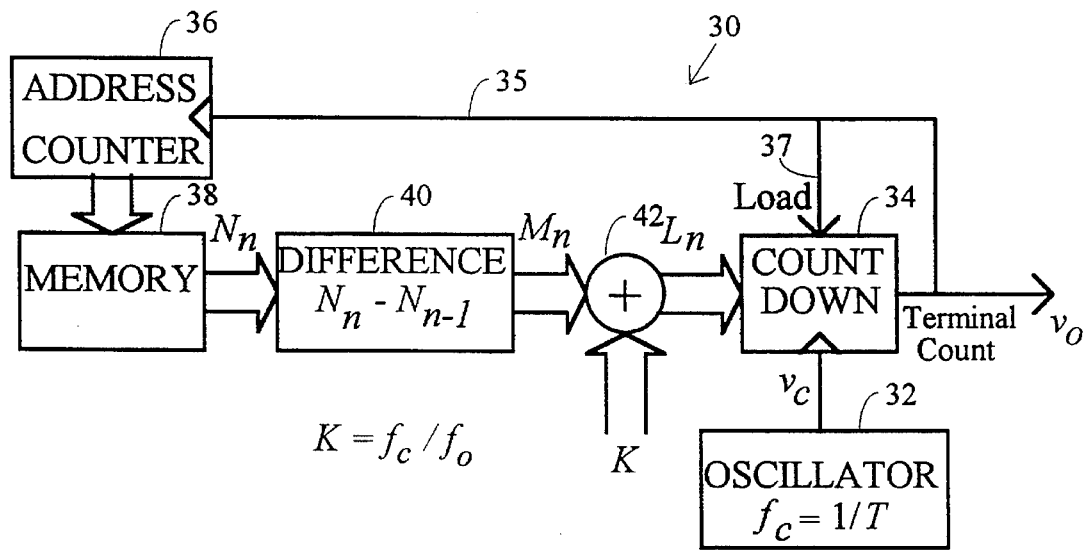
FIG. 6 is a block diagram of another embodiment of the present invention.

One particular embodiment of the present invention is shown in FIG. 6. Here, an input signal $v_c$ from an oscillator 32 has a frequency $f_c$ chosen so that $f_c=1/T$, and $f_o=f_c/K$, where $f_o$ is the nominal frequency of the output signal, $v_o$. The values $N_n$ located in memory 38 are converted by differentiator 40 into values $M_n$ representing the difference between succeeding $N_n$: $M_n = N_n - N_{n-1}$. The values $M_n$ are added to a constant K (where $K=f_c/f_o$) by summer 42, resulting in values $L_n$ representing the spacing $t_n - t_{n-1}$ between successive edges of the output signal as shown in the equations above. Each $L_n$ is loaded into a count-down circuit 34, such as a Motorola MC10136 programmable interval counter, which is clocked at a frequency of $f_c=1/T$. After $L_n$ clock cycles, the count-down circuit 34 reaches the terminal count (one), the output of which steps an address counter 36 on counter signal 35 for fetching the next $N_n$ in memory 38. The output signal $v_o$ also prepares the count-down circuit 34 for a load on the next clock cycle on load signal 37.

It should be noted that there are known techniques for phase shifting that use count-down circuits. In one technique, the output signal is used to prepare a count-down circuit for loading a delay value L. This loading alone, however, does not change the value of L. Any changes in the delay value L are made independent of the output signal, unlike the present invention which steps a sequence of control values in response to the output signal. Thus, the known techniques produce relatively static phase shifting and do not achieve the high frequency, dynamic phase modulation of the present invention.

Figure 7:
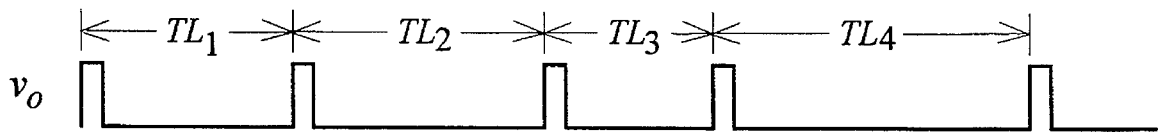
FIG. 7 is a timing diagram of the modulated output signal produced by the phase modulator of FIG. 6.

The modulated square wave output $v_o$ consists of the terminal counts output from the count-down circuit 34, as shown in FIG. 7. The terminal counts, which are spaced $T \times L_n$ apart, are represented here as narrow pulses. These pulses can be widened easily by a one-shot multivibrator or by another count-down circuit (not shown).

Figure 8:
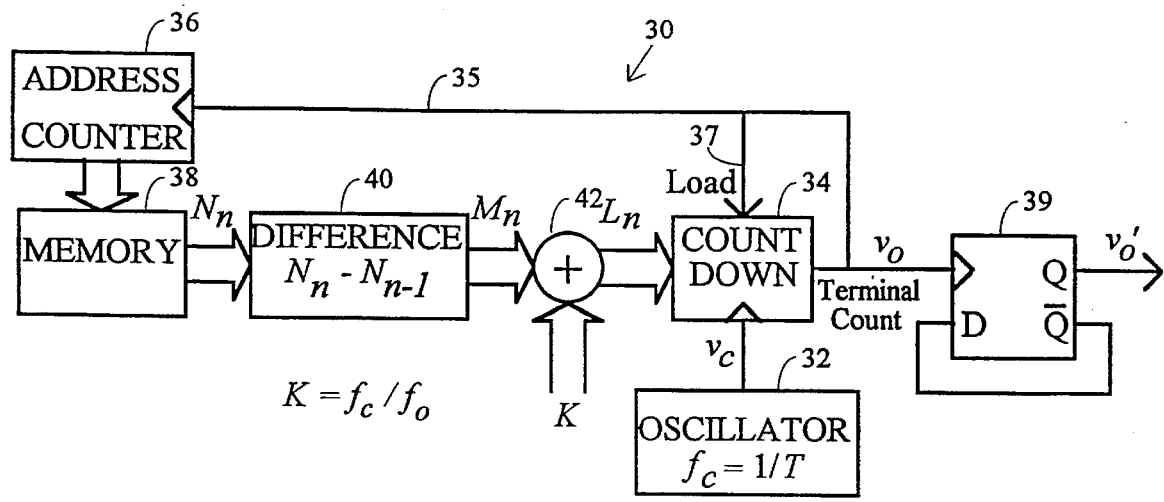
FIG. 8 is a block diagram of the embodiment of FIG. 6 with a flip-flop to position the rising and falling edges.
Figure 9:
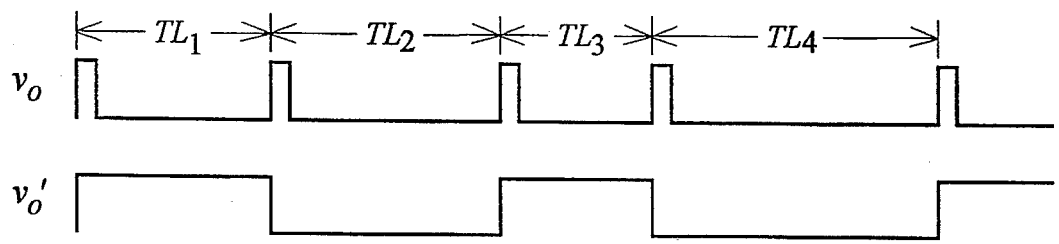
FIG. 9 is a timing diagram of the modulated output signal produced by the phase modulator of FIG. 8.

The implementation in FIG. 6 positions only the rising edges. Both rising and falling edges can be positioned by using $v_o$ to clock a toggle flip-flop as shown in FIG. 8. The alternate embodiment of FIG. 8 operates in the same manner as the embodiment of FIG. 6, except that the output of count-down circuit 34 serves as the input to toggle flip-flop 39. As shown in FIG. 9, the rising and falling edges of the flip-flop output signal $v_o'$ are positioned based upon the rising edges of signal $v_o$.

Figure 10:
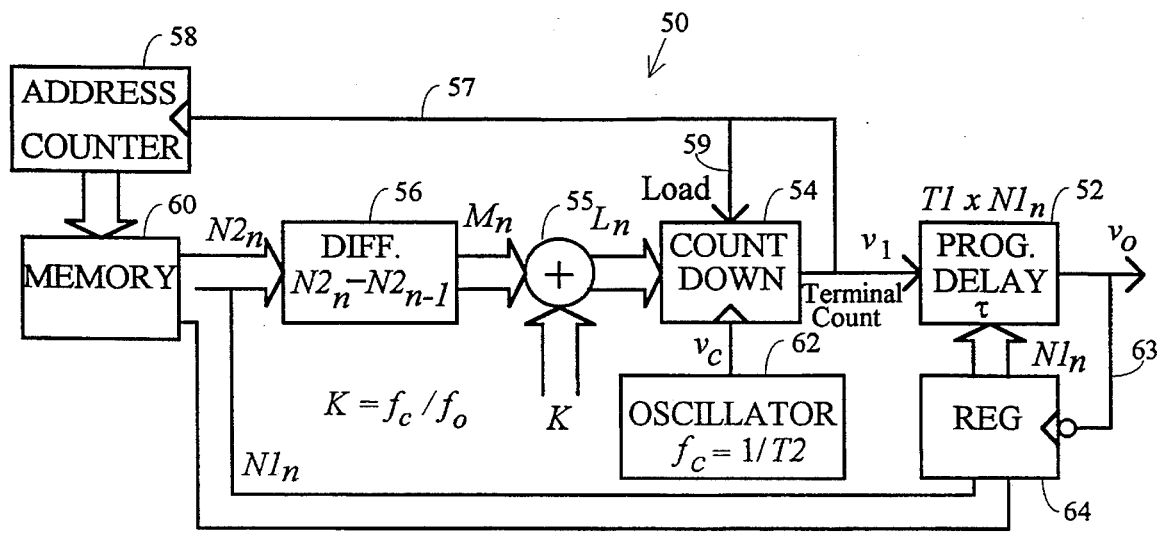
FIG. 10 is a block diagram of a preferred embodiment of the present invention.

The resolution of the phase modulator 30 shown in FIG. 6 is $T=1/f_c$. For the resolution to be less than a nanosecond, the oscillator frequency must be greater than 1 GHz, which requires more expensive circuitry. A less expensive way to make the resolution smaller without increasing $f_c$ is shown in FIG. 10. In this preferred embodiment, a phase modulator 50 achieves fine resolution by using a programmable delay 52 with delay $\tau_n = T1 \times N1_n$, where the fine-resolution values $N1_n$ are preferably stored in a memory 60. The coarse resolution is achieved with a count-down circuit 54 clocked at $f_c=1/T2$, based on the coarse-resolution values $N2_n$ also stored in the memory 60. These values are derived from the original position values $N_n$ by:

$$N_n \Delta t_n / T1$$

$$N1_n = N_n \bmod R,$$

$$N2_n = (N_n - N1_n)/R. \tag{Eq. 2}$$

where $R=T2/T1$, and the "mod" operation adds or subtracts R from $N_n$ until $N1_n$ lies in the range from 0 to R−1. Then $N_n = R \times N2_n + N1_n$. Since the stored values are binary, this calculation is made easier if R is a power of two.

Figure 11:
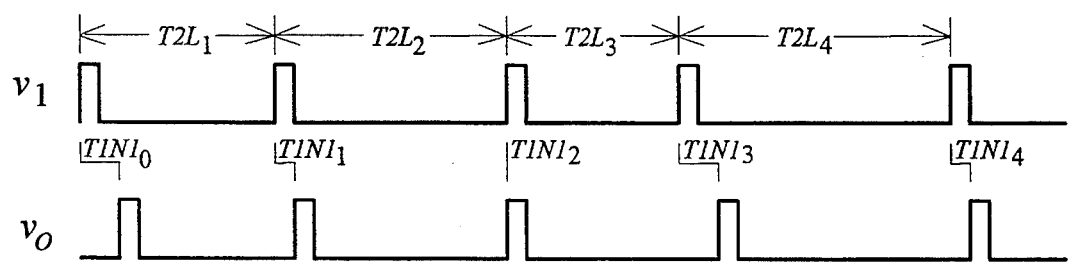
FIG. 11 is a timing diagram of the fine resolution achievable with the phase modulator of FIG. 10.

Here, an input signal $v_c$ from an oscillator 62 has a frequency $f_c$ chosen so that $f_c=1/T2$. The values $N2_n$ located in memory 60 are converted by differentiator 56 into values $M_n$ representing the difference between succeeding $N2_n$: $M_n = N2_n - N2_{n-1}$. The values $M_n$ are added to a constant K by summer 55, where $K = f_c/f_o$, resulting in values $L_n$ representing the spacing between successive edges of an intermediate signal $v_l$. Each $L_n$ is loaded into the count-down circuit 54, which is clocked at a frequency of $f_c=1/T2$. After $L_n$ clock cycles, the count-down circuit 54 reaches the terminal count, which steps an address counter 58 on counter signal 57 and prepares the count-down circuit 54 for a load on the next clock cycle on load signal 59. The address counter 58 steps the memory 60 to output the next values $N2_n$ and $N1_n$. The modulated intermediate signal $v_l$ consists of the terminal counts output from the count-down circuit 54 and are spaced $T2 \times L_n$ apart, as shown in FIG. 11.

Referring again to FIG. 10, the intermediate signal $v_l$ forms an input to the programmable delay circuit 52. The falling edge of each delayed terminal count on register signal 63 steps the next $N1_n$ from register 64 for producing the delay $\tau_n = T1 \times N1_n$ in the programmable delay circuit 52. The fine resolution T1 can be made arbitrarily small, limited only by the accuracy and stability of the delays. In a variation of this embodiment, the difference and summation processes can be performed before the values are stored in memory; the $L_n$ can be stored rather than the $N2_n$.

An algorithm to determine edge positions will now be described. For an unmodulated square wave, the phase p(t) in cycles increases linearly with time: $p(t)=f_o t$. The phase of a modulated square wave is $p(t)= f_o t + \Delta p(t)$, where $\Delta p(t)$ is the desired phase modulation in cycles. A rising edge will occur when p(t) is an integer (0, 1, 2, ... ). Then the time $t_n$ of the nth rising edge is found by solving Eq. 3 for $t_n$.

$$f_o t_n + \Delta p(t_n) = n, \quad \Delta t_n = t_n - n/f_o. \tag{Eq. 3}$$

This equation cannot be solved in general, and the $t_n$ must be found by trial and error. However, a good approximation to $t_n$ can be found with an iterative equation. Without loss of generality, let $p(0)=0$. Then $$\Delta f(t) \equiv \frac{d}{dt} \Delta p(t), \tag{Eq. 4}$$

$$t_0 = 0,$$

$$t_{n+1} = t_n + \frac{1}{f_o + \Delta f(t_n + 0.5/f_o)},$$

$$\Delta t_n = t_n - n/f_o.$$

Taking a specific example of nominal frequency $f_o = 16$ and a sinusoidal phase modulation of $\Delta p(t)=(6/2\pi)\cdot\sin(2\pi t)$, then $\Delta f(t)=6\cdot\cos(2\pi t)$, and the $\Delta t_n$ found from Eq. 4 are shown in the table below. Also shown in the table are the ideal values for $\Delta t_n$ determined from Eq. 3. For this case, the difference between the $\Delta t_n$ determined from Eq. 4 and the ideal $\Delta t_n$ is less than 6%. If the resolution is T=0.0001, then the numbers stored in memory are found by Eq. 1 (see the $N_n$ in the table). If the phase modulator is to be implemented with a delay line as in FIG. 10 with T1= 0.0001, T2= 0.0005, R= 5, and K= 125, then the fine-resolution numbers and the coarse-resolution numbers are found by Eq. 2 (see $N1_n$ and $N2_n$ in the table).

| n  | $\Delta t_n$ (ideal) | $\Delta t_n$ | $N_n$ | $N1_n$ | $N2_n$ |
|----|---------------------|--------------|-------|--------|--------|
| 0  | 0.0000              | 0.0000       | 0     | 0      | 0      |
| 1  | −0.0169             | −0.0168      | −168  | 2      | −34    |
| 2  | −0.0327             | −0.0324      | −324  | 1      | −65    |
| 3  | −0.0463             | −0.0456      | −456  | 4      | −92    |
| 4  | −0.0560             | −0.0548      | −548  | 2      | −110   |
| 5  | −0.0597             | −0.0581      | −581  | 4      | −117   |
| 6  | −0.0538             | −0.0524      | −524  | 1      | −105   |
| 7  | −0.0340             | −0.0340      | −340  | 0      | −68    |
| 8  | 0.0000              | −0.0012      | −12   | 3      | −3     |
| 9  | 0.0340              | 0.0352       | 352   | 2      | 70     |
| 10 | 0.0538              | 0.0570       | 570   | 0      | 114    |
| 11 | 0.0597              | 0.0629       | 629   | 4      | 125    |
| 12 | 0.0560              | 0.0586       | 586   | 1      | 117    |
| 13 | 0.0463              | 0.0481       | 481   | 1      | 96     |
| 14 | 0.0327              | 0.0340       | 340   | 0      | 68     |
| 15 | 0.0169              | 0.0178       | 178   | 3      | 35     |
| 16 | 0.0000              | 0.0008       | 8     | 3      | 1      |

If either $|\Delta p(t)| \ll 1$ or $|\Delta f| \ll f_o$, then there is an even simpler algorithm to approximate $\Delta t_n$:

$$\Delta t_n = \frac{-\Delta p(n/f_o)}{f_o} \quad \text{(Eq. 5)}$$

If the phase slope is bounded by $|N2_n - N2_{n-1}| < K/2$, then $N_n$ can be reduced to conserve memory. Replace $N2_n$ with $N3_n = N2_n \mod K$, and replace the operation $L_n = N2_n - N2_{n-1} + K$ with:

$$L_n = N3_n - N3_{n-1} + 2K \quad \text{for} \quad N3_n - N3_{n-1} < -K/2$$
$$L_n = N3_n - N3_{n-1} + K \quad \text{for} \quad -K/2 \leq N3_n - N3_{n-1} < K/2 \quad \text{(Eq. 6)}$$
$$L_n = N3_n - N3_{n-1} \quad \text{for} \quad K/2 \leq N3_n - N3_{n-1}.$$

This operation is easily implemented when $K = 2^k$ by performing the subtraction in k-bit signed numbers and always adding only K.

When the desired output frequency $f_o$ is very high, it is desirable to make the oscillator frequency $f_c$ equal $f_o$ to avoid an expensive high-frequency count-down circuit. Then all of the phase modulation is done with the programmable delay, and $N_n = N1_n$ (there is no $N2_n$). Let $T2=1/f_o$, and $R \equiv T2/T1$, where T1 is the resolution of the delay. If the phase slope is bounded by $|N1_n - N1_{n-1}| < R/4$, then $N1_n$ can be reduced to conserve memory and to reduce the size of the programmable delay. Replace $N1_n$ with $N3_n = N1_n \mod R$.

Figure 12:
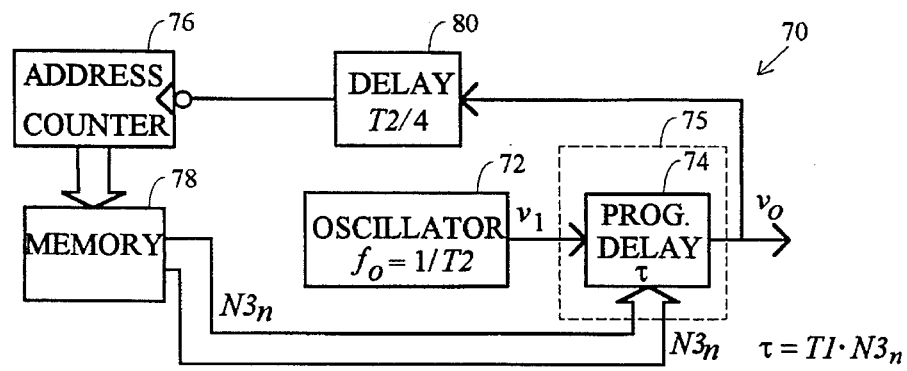
FIG. 12 is a block diagram of an embodiment of the present invention without a count-down circuit.
Figure 13:
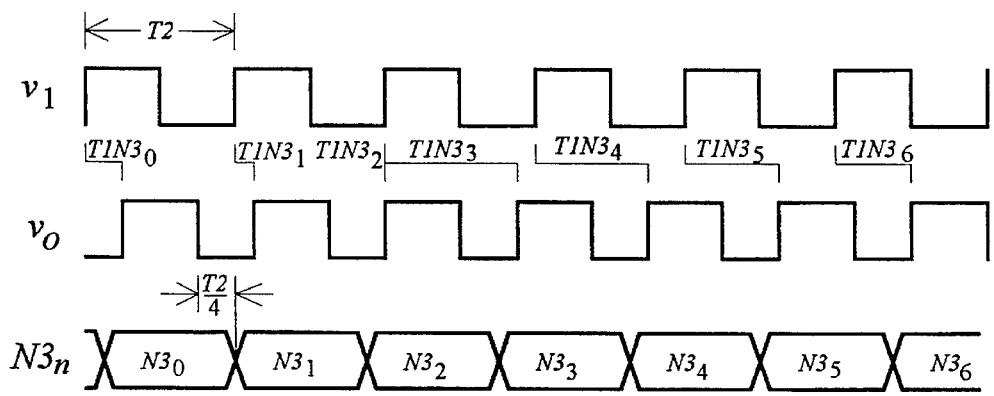
FIG. 13 is a timing diagram of the modulated output signal produced by the phase modulator of FIG. 12.

An embodiment without a count-down circuit is shown in FIG. 12. It is usually convenient for the duty cycle of $v_I$ to be 50%, especially for higher frequency operation to allow for greater range. The falling edge of the delayed signal $v_o$ output from a programmable delay 74 advances an address counter 76 after an additional delay of T2/4. Given the bound on the phase slope, this additional delay assures that the waveform of $v_o$ is low both immediately before and immediately after the change in $N3_n$. The address counter 76 steps the memory 78 to output the next $N3_n$. The waveforms for $v_I$ and $v_o$ shown in FIG. 13 are for an example where R= 8 and the N3 sequence is 2, 1, 0, 7, 6, 5, 4. Note that the third rising edge of $v_I$ appears twice in $v_o$, delayed first by $T1N3_2 = 0$ and then by $T1N3_3 = T1 \times 7$.

Figure 14:
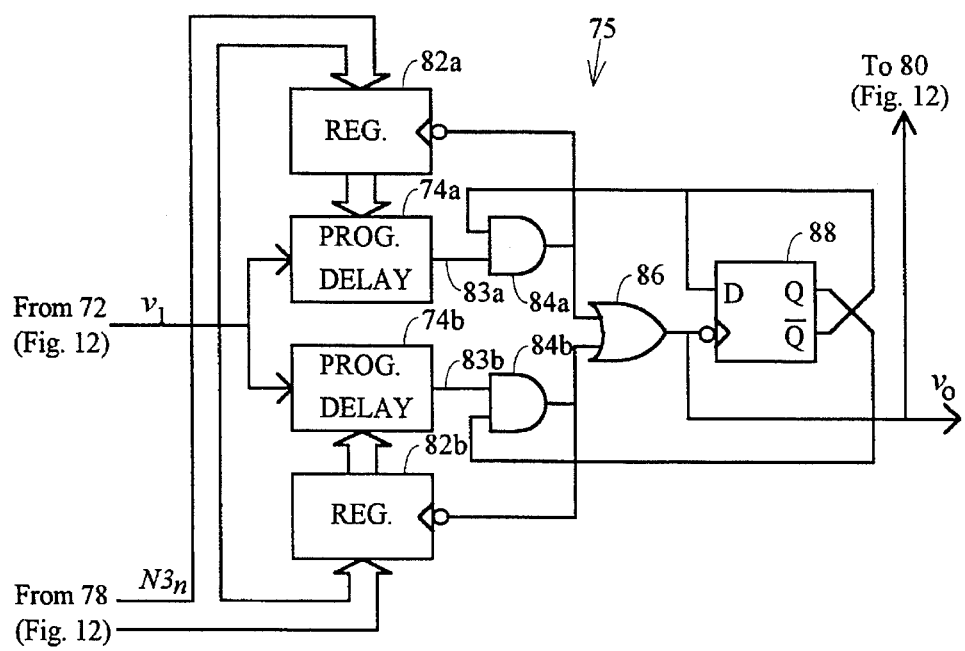
FIG. 14 is a schematic block diagram of a programmable delay comprising two delay lines.

If the programmable delay 74 has significant set-up time (compared to T2) before the delayed waveform is available after applying a new $N3_n$, then two programmable delays may be necessary. FIG. 14 illustrates a possible implementation of alternating delay line circuit 75 in place of block 75 from FIG. 12. The delay lines 74a and 74b each receive the input signal $v_I$ and the control values $N3_n$. The delay line 74a handles the odd-ordered $N3_n$ while the delay line 74b handles the even-ordered $N3_n$. The next succeeding control value $N3_n$ is placed in registers 82a or 82b for being alternately loaded into the respective delay lines 74a and 74b. Output logic comprising AND gates 84a and 84b, OR gate 86, and type D flip-flop 88 performs a multiplexing function on the output of the delay lines 74a and 74b. The output logic also controls the alternating operation of the delay lines.

Specifically, the delay line output signal 83a forms an input to AND gate 84a and delay line output signal 83b is an input to AND gate 84b. The Q and $\overline{Q}$ output signals of flip-flop 88 form the other inputs to AND gates 84a and 84b. The OR gate 86 combines the output of AND gates 84a and 84b to form the modulated output signal $v_o$. The output of OR gate 86 is also inverted to serve as the clock input to flip-flop 88. With each cycle of input signal $v_I$, the delayed outputs of delay lines 74a and 74b are alternately selected through the operation of flip-flop 88. The outputs of AND gates 84a and 84b are also inverted to enable respective registers 82a and 82b.

As noted above, the aspect of the invention whereby the transition to a new control value is made in response to the edges of the output signal allows the generation of spurious, misplaced, or missing edges in the output signal to be avoided. Having described several embodiments of the present invention, the following discussion focuses on the additional conditions required to avoid the undesired edges in the output signal.

Figure 15:
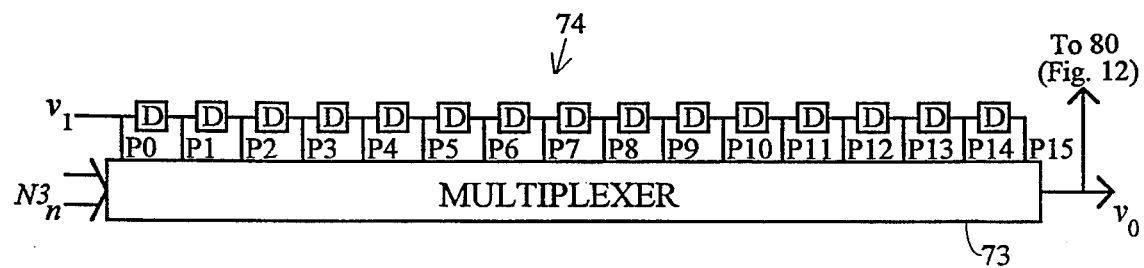
FIG. 15 is a block diagram of the programmable delay circuit of FIG. 12.

FIG. 15 shows the detail of the programmable delay 74 of FIG. 12. The programmable delay 74 includes a series of delay sections, D, each delay section adding a fixed delay of T2/16, where T2= $1/f_o$, to the input signal $v_I$. A series of taps, P0 through P15, are coupled in parallel between the delay sections D and a multiplexer 73 to produce the output signal $v_o$, dependent on the delay value $N3_n$ input to the multiplexer 73.

Figure 16:
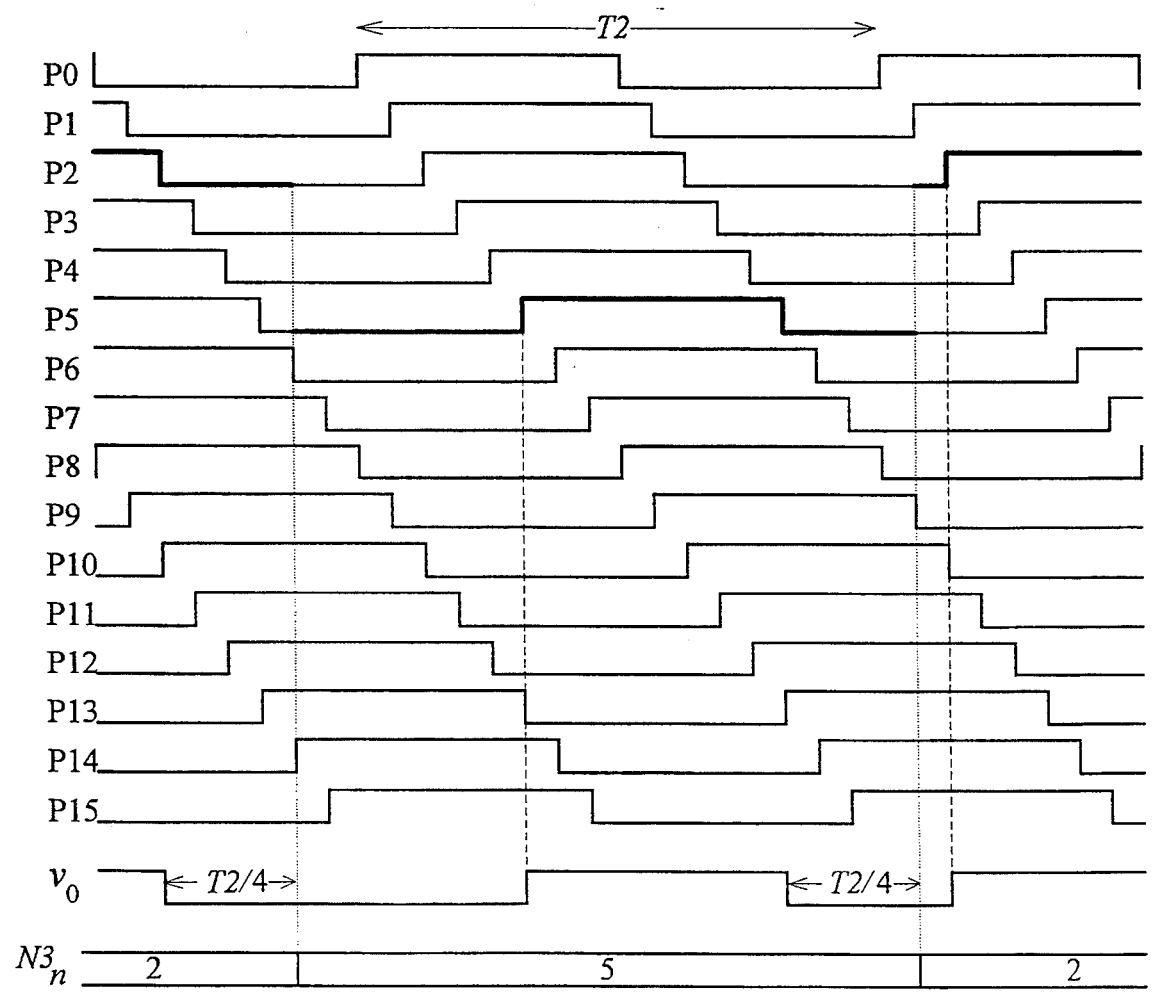
FIG. 16 is a timing diagram of the modulated output signal produced by the programmable delay circuit of FIG. 15 having correct transition timing and bounded phase slope.

The timing diagram of FIG. 16 shows the relationship between the delay taps, P0 to P15, and the output signal $v_o$ of the delay 74. As can be seen from the diagram, the value $N3_n$ changes a time T2/4 after the falling edge of $v_o$. Since the phase slope is bounded by $|N3_n - N3_{n-1}| < R/4$, where R= T2/T1 and T1 is the resolution of the programmable delay, the rising edges of $v_o$ are correctly placed.

Figure 17:
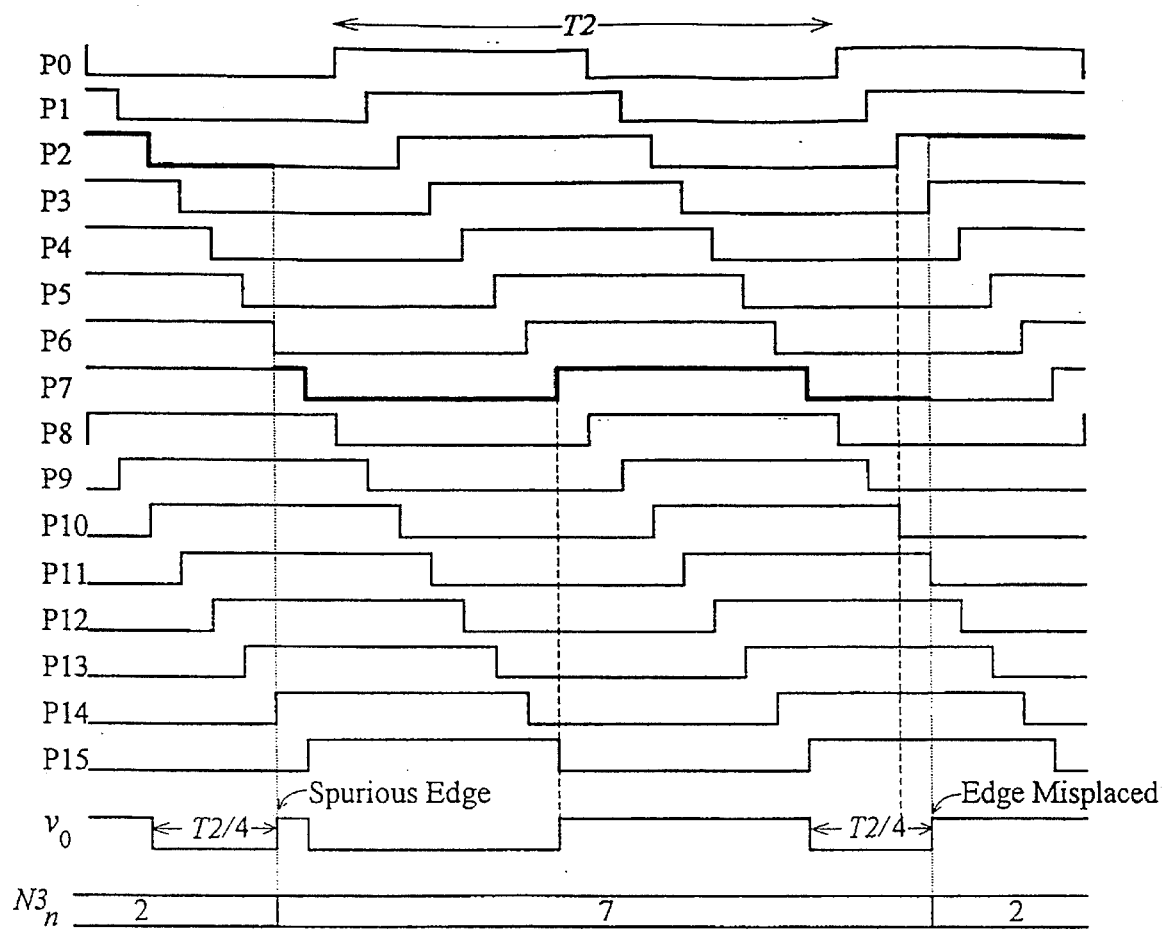
FIG. 17 is a timing diagram similar to FIG. 16 except the phase slope is unbounded.
Figure 18:
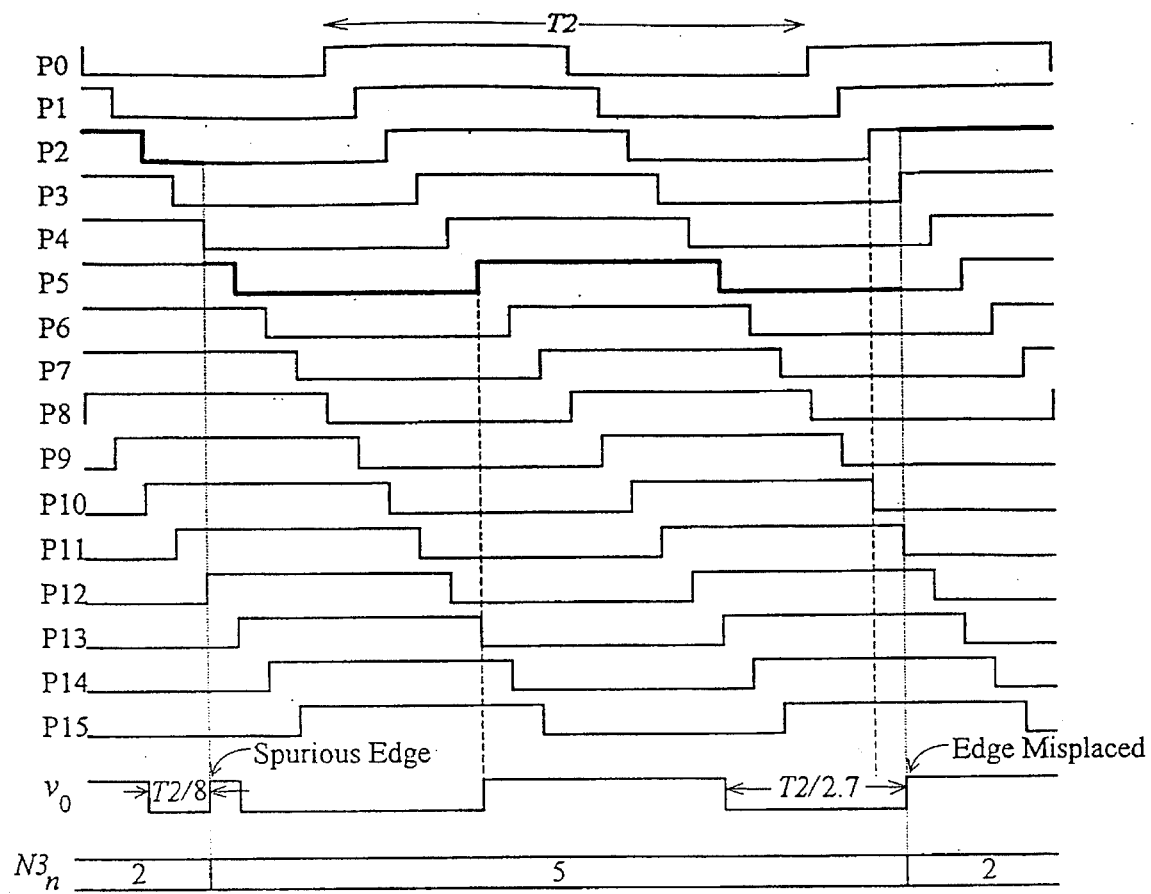
FIG. 18 is a timing diagram similar to FIG. 16 except the transition timing is incorrect.

In contrast, FIG. 17 illustrates the undesirable result produced when the phase slope is not bounded. An unbounded phase slope, i.e., too large a phase change, results in both spurious and misplaced edges in the output signal $v_o$. A similar undesirable output results when the transition time to a new control value is incorrect. The correct transition time assures that the output signal $v_o$ is low both immediately before and immediately after the change in $N3_n$. FIG. 18 shows the spurious and misplaced edges resulting from incorrect transition times of T2/8 and T2/2.7, for example.

Figure 19:
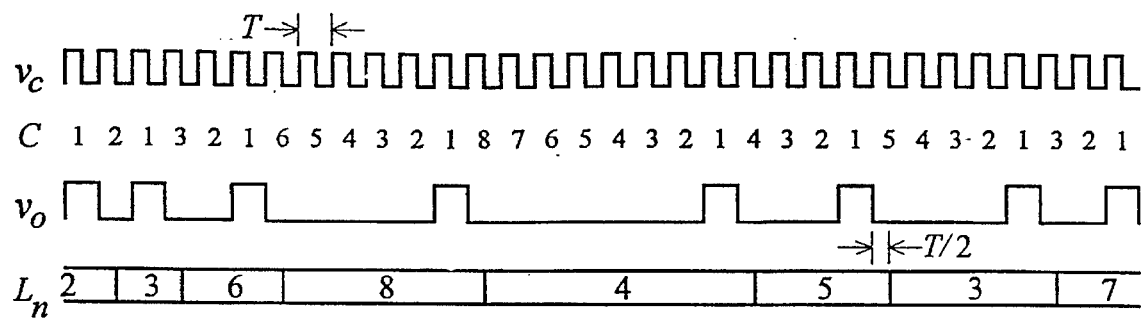
FIG. 19 is a timing diagram of the modulated output signal produced by the programmable interval counter of FIG. 6 having correct transition timing.

An embodiment of the invention in which the programmable pulse generator is a count-down circuit was shown earlier in FIG. 6. The timing diagram of FIG. 19 shows that such an embodiment correctly places edges of the output signal $v_o$ when the control values $L_n$ are changed a transition time T/2 after the falling edge of $v_o$. The transition time of T/2 allows for greatest flexibility in changing phase.

Figure 20:
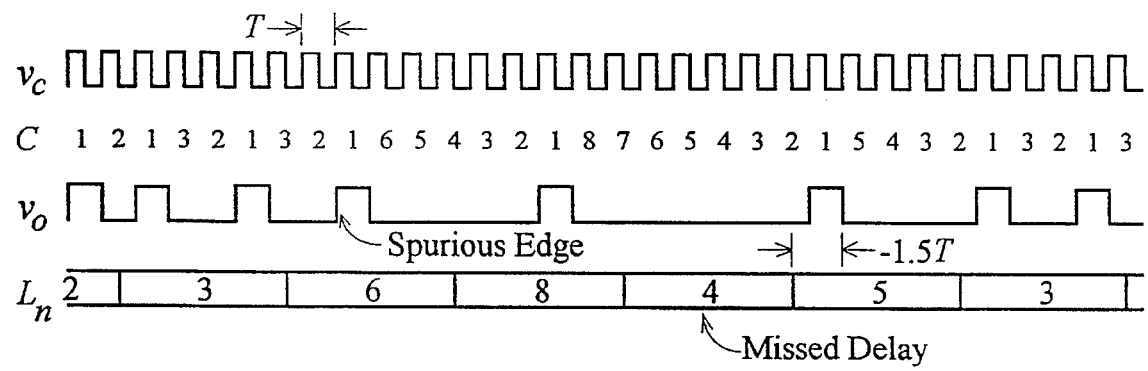
FIG. 20 is a timing diagram similar to FIG. 19 except the transition timing is incorrect.

In contrast, FIG. 20 illustrates the undesirable results produced when the control values $L_n$ are changed independent of the output signal $v_o$. In this example, the values $L_n$ are changed instead every 5T, where T is the period of the oscillator signal $v_c$. The timing diagram of FIG. 20 shows an extra "spurious" edge produced when $L_n$= 3. An edge associated with $L_n$= 4 is missed because by the time the count-down circuit has finished counting down from the previous value of $L_{n-1}$= 8, the next value, $L_{n+1}$5, has been loaded.

The previous examples illustrate that making the transition timing of the control values responsive to the output signal of the programmable pulse generator is necessary to be able to avoid spurious, misplaced, or missing edges. In addition, phase slope bounding and correct transition timing are also necessary to achieve desirable results.

The algorithms and numerical processes described herein to determine the control values do not restrict the invention to the use of those algorithms and processes. They are cited only to show that it is possible to achieve practical phase modulation with the embodiments described.

EQUIVALENTS

While this invention has been particularly shown and described with references to preferred embodiments thereof, it will be understood by those skilled in the art that various changes in form and details may be made therein without departing from the spirit and scope of the invention as defined by the appended claims.

What is claimed is:

1. A dynamic phase modulator comprising:
   a programmable pulse generator for producing a pulsed output signal wherein the position of each pulse edge of the output signal is determined in response to a control value provided to the programmable pulse generator; and
   a control value source coupled to the programmable pulse generator for producing a dynamic sequence of control values, the control values determining the times between successive output pulses.

2. The phase modulator of claim 1 wherein the control value source comprises memory.

3. The phase modulator of claim 2 wherein the programmable pulse generator comprises a programmable interval counter.

4. The phase modulator of claim 2 wherein the programmable pulse generator comprises a programmable delay circuit.

5. The phase modulator of claim 1 wherein the programmable pulse generator comprises a programmable interval counter.

6. The phase modulator of claim 1 wherein the programmable pulse generator comprises a programmable delay circuit.

7. The phase modulator of claim 1 wherein the next control value in the sequence is loaded in response to an edge of the output signal.

8. The phase modulator of claim 1 wherein each control value in the sequence is provided to the programmable pulse generator in response to each respective edge of the output signal.

9. A phase modulator for modulating a waveform comprising:
   a programmable pulse generator, coupled to receive the waveform, for producing a pulsed output signal wherein the position of each edge of the output signal relative to the waveform is determined in response to a control value provided to the programmable pulse generator; and
   a control value source coupled to the programmable pulse generator for producing a sequence of control values wherein the next control value in the sequence is provided to the programmable pulse generator in response to an edge of the output signal.

10. The phase modulator of claim 9 wherein the control value source comprises memory.

11. The phase modulator of claim 10 wherein the programmable pulse generator comprises a programmable interval counter.

12. The phase modulator of claim 10 wherein the programmable pulse generator comprises a programmable delay circuit.

13. The phase modulator of claim 9 wherein the programmable pulse generator comprises a programmable interval counter.

14. The phase modulator of claim 9 wherein the programmable pulse generator comprises a programmable delay circuit.

15. The phase modulator of claim 14 wherein the programmable delay circuit further comprises first and second programmable delay lines coupled in parallel to receive the waveform, the first programmable delay line producing a first intermediate signal responsive to the odd ordered control values in the sequence, the second programmable delay line producing a second intermediate signal responsive to the even ordered control values in the sequence, the first and second intermediate signals being multiplexed to produce an output signal.

16. The phase modulator of claim 9 wherein the waveform comprises a square wave signal produced by an oscillator.

17. The phase modulator of claim 9 wherein the control value source includes a numerical processor for converting a first value, corresponding to the time difference between the position of an edge of the output signal and its position if the waveform had not been modulated, to a second value corresponding to the time difference between successive edges of the output signal, the second value being the control value.

18. A phase modulator for modulating a waveform comprising:
   a programmable pulse generator, coupled to receive the waveform, for producing a pulsed output signal wherein the position of each pulse edge of the output signal relative to the waveform is determined in response to a control value provided to the programmable pulse generator; and
   a control value source coupled to the programmable pulse generator for producing a sequence of control values wherein the next control value in the sequence is provided to the programmable pulse generator at a time between successive edges of the output signal which assures desired edge generation.

19. The phase modulator of claim 18 wherein the control value source comprises memory.

20. The phase modulator of claim 19 wherein the programmable pulse generator comprises a programmable interval counter.

21. The phase modulator of claim 19 wherein the programmable pulse generator comprises a programmable delay circuit.

22. The phase modulator of claim 18 wherein the programmable pulse generator comprises a programmable interval counter.

23. The phase modulator of claim 18 wherein the programmable pulse generator comprises a programmable delay circuit.

24. The phase modulator of claim 23 wherein the pulsed output signal has a 50% duty cycle and differences between succeeding control values are bounded to further assure desired edge generation.

25. The phase modulator of claim 18 wherein the control value source includes a numerical processor for converting a first value, corresponding to the time difference between the position of an edge of the output signal and its position if the waveform had not been modulated, to a second value corresponding to the time difference between successive edges of the output signal, the second value being the control value.

26. A phase modulator for modulating a waveform comprising:
    a programmable interval counter, coupled to receive the waveform, for producing a pulsed intermediate signal wherein the position of each edge of the intermediate signal relative to the waveform is determined in response to a first control value provided to the programmable interval counter;
    a first control value source coupled to the programmable interval counter for producing a sequence of first control values wherein the next first control value in the sequence is provided to the programmable interval counter in response to an edge of the intermediate signal;
    a programmable delay circuit, coupled to receive the intermediate signal, for producing a pulsed output signal wherein the position of each edge of the output signal relative to the intermediate signal is determined in response to a second control value provided to the programmable delay circuit; and
    a second control value source coupled to the programmable delay circuit for producing a sequence of second control values wherein the next second control value in the sequence is provided to the programmable delay circuit in response to an edge of the output signal.

27. The phase modulator of claim 26 wherein the first and second control value sources comprise a common memory.

28. The phase modulator of claim 26 wherein the waveform comprises a square wave signal produced by an oscillator.

29. The phase modulator of claim 26 wherein the first control value source includes a numerical processor for converting a first value, corresponding to the time difference between the position of an edge of the intermediate signal and its position if the waveform had not been modulated, to a second value corresponding to the time difference between successive edges of the intermediate signal, the second value being the first control value.

30. A method of phase modulating a waveform comprising the steps of:
    receiving the waveform;
    outputting a pulsed output signal wherein the position of each edge of the output signal relative to the waveform is determined in response to receiving a control value; and
    producing a sequence of control values wherein the next control value in the sequence is provided in response to an edge of the output signal.

31. The method of claim 30 wherein the step of producing the sequence of control values comprises converting a first value, corresponding to the time difference between the position of an edge of the output signal and its position if the waveform had not been modulated, to a second value corresponding to the time difference between successive edges of the output signal, the second value being the control value.

32. The method of claim 30 wherein the step of receiving the waveform comprises receiving a square wave signal produced by an oscillator.

33. A method of phase modulating a waveform comprising the steps of:
    receiving the waveform;
    producing a pulsed intermediate signal wherein the position of each edge of the intermediate signal relative to the waveform is determined in response to receiving a first control value;
    producing a sequence of first control values wherein the next first control value in the sequence is provided in response to an edge of the intermediate signal;
    producing a pulsed output signal wherein the position of each edge of the output signal relative to the intermediate signal is determined in response to receiving a second control value; and
    producing a sequence of second control values wherein the next second control value in the sequence is provided in response to an edge of the output signal.

* * * * *